US009564920B2

United States Patent
Akkarakaran et al.

(10) Patent No.: US 9,564,920 B2
(45) Date of Patent: Feb. 7, 2017

(54) METHOD AND APPARATUS FOR MITIGATION OF FALSE PACKET DECODES DUE TO EARLY DECODING

(71) Applicant: QUALCOMM Incorporated, San Diego, CA (US)

(72) Inventors: Sony J. Akkarakaran, San Diego, CA (US); Sharad Deepak Sambhwani, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 298 days.

(21) Appl. No.: 13/771,852

(22) Filed: Feb. 20, 2013

(65) Prior Publication Data

US 2013/0227381 A1    Aug. 29, 2013

Related U.S. Application Data

(60) Provisional application No. 61/602,462, filed on Feb. 23, 2012.

(51) Int. Cl.
  *G06F 11/00* (2006.01)
  *H03M 13/09* (2006.01)
  *H04L 1/00* (2006.01)

(52) U.S. Cl.
  CPC .............. *H03M 13/09* (2013.01); *H04L 1/004* (2013.01)

(58) Field of Classification Search
  CPC ................................ H03M 13/09; H04L 1/004
  USPC ........................................................ 714/807
  See application file for complete search history.

(56) References Cited

U.S. PATENT DOCUMENTS

| 7,454,684 | B2 | 11/2008 | Allpress |
| 8,223,869 | B2 | 7/2012 | Bottero et al. |
| 2002/0118698 | A1* | 8/2002 | Koo ............... H04L 1/0041 370/441 |
| 2002/0178418 | A1* | 11/2002 | Ramprashad ......... H03M 13/09 714/755 |
| 2004/0260995 | A1* | 12/2004 | Allpress ...................... 714/755 |
| 2006/0187888 | A1* | 8/2006 | Chen ........................... 370/335 |

(Continued)

FOREIGN PATENT DOCUMENTS

| WO | 2009003067 A2 | 12/2008 |
| WO | 2009053825 A2 | 4/2009 |

OTHER PUBLICATIONS

International Search Report and Written Opinion—PCT/US2013/027462—ISA/EPO—May 3, 2013.

(Continued)

*Primary Examiner* — April Y Blair
*Assistant Examiner* — Thien D Nguyen
(74) *Attorney, Agent, or Firm* — Darren M. Simon

(57) ABSTRACT

Methods and apparatus for wireless communication in a wireless communication network include determining a transmit data packet size at a transmitting device and computing an early termination scheme associated with a receiving device. Aspects of the methods and apparatus include increasing a transmission length of a Cycle Redundancy Check (CRC) field associated with the transmit data packet before transmission of the transmit data packet, wherein the transmitted length of the CRC field is based on the early decoding scheme. Aspects also include transmitting the transmit data packet with the increased transmission length of the CRC field to the receiving device.

14 Claims, 10 Drawing Sheets

(56) References Cited

U.S. PATENT DOCUMENTS

| | | | |
|---|---|---|---|
| 2007/0297451 A1* | 12/2007 | Kim | H04L 1/0041 |
| | | | 370/469 |
| 2009/0029706 A1 | 1/2009 | Prakash | |
| 2009/0285137 A1* | 11/2009 | Fujita et al. | 370/310 |
| 2009/0303976 A1* | 12/2009 | Jou | H04L 1/0025 |
| | | | 370/342 |
| 2009/0304024 A1* | 12/2009 | Jou et al. | 370/465 |
| 2010/0125777 A1* | 5/2010 | Wang et al. | 714/807 |
| 2010/0205518 A1 | 8/2010 | Golitschek et al. | |
| 2011/0258511 A1* | 10/2011 | Mayo et al. | 714/755 |
| 2011/0289384 A1* | 11/2011 | Lee | G06F 11/1008 |
| | | | 714/763 |
| 2013/0054850 A1* | 2/2013 | Co | H04L 12/4633 |
| | | | 710/105 |

OTHER PUBLICATIONS

Ma Z., et al., "A Joint early detection-early stopping scheme for short-frame turbo decoding", International Journal of Electronics and Communications, 2011, pp. 37-43, vol. 65.

Motorola: "CRC length for Control Channels", 3GPP Draft; R1-074569 CRC Length for Control Channels, 3rd Generation Partnership Project (3GPP), Mobile Competence Centre ; 650, Route Des Lucioles ; F-06921 Sophia-Antipolis Cedex ; France, vol. RAN WG1, No. Korea 20071030, Oct. 30, 2007 (Oct. 30, 2007), XP050108062, [retrieved on Oct. 30, 2007].

QUALCOMM Europe: "CRC length for PDCCH", 3GPP Draft; R1-080477, 3rd Generation Partnership Project (3GPP), Mobile Competence Centre ; 650, Route Des Lucioles; F-06921 Sophia-Antipolis Cedex; France, vol. RAN WG1, No. Sevilla, Spain: 20080109, Jan. 9, 2008 (Jan. 9, 2008), XP050108995, [retrieved on Jan. 9, 2008].

* cited by examiner

METHOD AND APPARATUS FOR MITIGATION OF FALSE PACKET DECODES DUE TO EARLY DECODING

CLAIM OF PRIORITY UNDER 35 U.S.C §119

The present Application for Patent claims priority to U.S. Provisional Application No. 61/602,462 entitled "MITIGATION OF FALSE PACKET DECODES DUE TO EARLY DECODING" filed Feb. 23, 2012, and assigned to the assignee hereof and hereby expressly incorporated by reference.

BACKGROUND

Field

Aspects of the present disclosure relate generally to wireless communication systems, and more particularly, to an apparatus and method for improving wireless communication system capacity and reducing power by improving the strength of the cycle redundancy check.

Background

Wireless communication networks are widely deployed to provide various communication services such as telephony, video, data, messaging, broadcasts, and so on. Such networks, which are usually multiple access networks, support communications for multiple users by sharing the available network resources. One example of such a network is the UMTS Terrestrial Radio Access Network (UTRAN). The UTRAN is the radio access network (RAN) defined as a part of the Universal Mobile Telecommunications System (UMTS), a third generation (3G) mobile phone technology supported by the 3rd Generation Partnership Project (3GPP). The UMTS, which is the successor to Global System for Mobile Communications (GSM) technologies, currently supports various air interface standards, such as Wideband-Code Division Multiple Access (W-CDMA), Time Division-Code Division Multiple Access (TD-CDMA), and Time Division-Synchronous Code Division Multiple Access (TD-SCDMA). The UMTS also supports enhanced 3G data communications protocols, such as High Speed Packet Access (HSDPA), which provides higher data transfer speeds and capacity to associated UMTS networks.

As the demand for mobile broadband access continues to increase, research and development continue to advance the UMTS technologies not only to meet the growing demand for mobile broadband access, but to advance and enhance the user experience with mobile communications.

Generally, R99 packets transmitted over multiple transmission time intervals (TTIs) are often decoded by a receiver prior to reception of the entire packet for each packet TTI. Due to the early decoding of the packet, the receiver subsystems may be able to be powered down from the time of successful early packet decoding leading both to efficient packet transmission for the transmitter and increased power consumption savings for the receiver. Decoding success is typically assessed by the receiver utilizing the cycle redundancy check (CRC) attached to the transmission packet. However, improperly extrapolated bits may accidentally pass the CRC impacting link and system performance.

Thus, aspects of this apparatus and method include improving the strength of the CRC, thereby upgrading the quality of voice traffic and improving system performance in a wireless communication system.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

A method of upgrading the quality of voice traffic and improving system performance in a wireless communication system is provided. The method includes determining a transmit data packet size at a transmitting device. Further, the method includes computing an early termination scheme associated with a receiving device. Additionally, the method includes increasing a transmission length of a CRC field associated with the transmit data packet before transmission of the transmit data packet, wherein the transmitted length of the CRC field is based on the early decoding scheme. Still further, the method includes transmitting the transmit data packet with the increased transmission length of the CRC field to the receiving device.

In another aspect, an apparatus for upgrading the quality of voice traffic and improving system performance in a wireless communication system includes a processor configured to determine a transmit data packet size at a transmitting device. Further, the processor is configured to compute an early termination scheme associated with a receiving device. Additionally, the processor is configured to increase a transmission length of a CRC field associated with the transmit data packet before transmission of the transmit data packet, wherein the transmitted length of the CRC field is based on the early decoding scheme. Still further, the processor is configured to transmit the transmit data packet with the increased transmission length of the CRC field to the receiving device.

Additionally, in another aspect, an apparatus for upgrading the quality of voice traffic and improving system performance in a wireless communication system includes means for determining a transmit data packet size at a transmitting device. Further, the apparatus includes means for computing an early termination scheme associated with a receiving device. Additionally, the apparatus includes means for increasing a transmission length of a CRC field associated with the transmit data packet before transmission of the transmit data packet, wherein the transmitted length of the CRC field is based on the early decoding scheme. Still further, the apparatus includes means for transmitting the transmit data packet with the increased transmission length of the CRC field to the receiving device.

In another aspect, a computer-readable media that may include machine-executable code for upgrading the quality of voice traffic and improving system performance in a wireless communication system includes code for determining a transmit data packet size at a transmitting device. Further, the code may be executable for computing an early termination scheme associated with a receiving device. Additionally, the code may be executable for increasing a transmission length of a CRC field associated with the transmit data packet before transmission of the transmit data packet, wherein the transmitted length of the CRC field is based on the early decoding scheme. Still further, the code may be executable for transmitting the transmit data packet with the increased transmission length of the CRC field to the receiving device.

These and other aspects of the disclosure will become more fully understood upon a review of the detailed description, which follows.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

As discussed above, R99 packets transmitted over TTIs of 10 ms, 20 ms, 40 ms or 80 ms are often decoded by a receiver prior to reception of the entire packet for each packet TTI. Substantial system capacity gains are possible when the transmitter stops the packet transmission as soon as the transmitter is made aware that the receiver has succeeded in decoding the packet early. As such, decoding success in this type of wireless communication system is typically assessed by the receiver utilizing the CRC attached to the transmission packet.

However, the reliability of the decoding assessment by a receiver, utilizing the CRC, decreases during early decoding, owing to incomplete receiver information. For instance, bits that have not yet been received by the receiver may easily be extrapolated by the receiver into a packet that may differ from the actual transmitted packet. This packet with these improperly extrapolated bits may still accidentally pass the CRC check. Such false CRC passes have serious impacts on link and system performance. Not only do these false CRC passes cause upper-layer retransmissions for data traffic, the false CRC passes may also severely degrade the quality of voice traffic.

Thus, aspects of this apparatus and method include improving the strength of the CRC check by increasing the length of the CRC, thereby upgrading the system performance in a wireless communication system.

Figure 1:
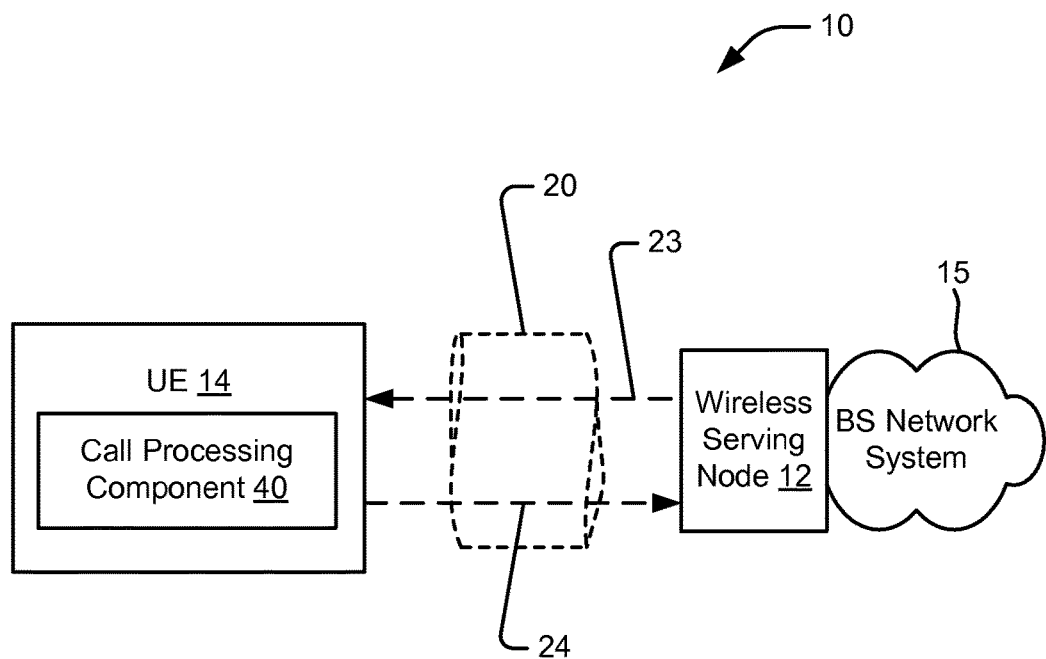
FIG. 1 is a schematic diagram illustrating an example wireless system of aspects of the present disclosure.

Referring to FIG. 1, in one aspect, a wireless communication system 10 is configured to facilitate transmitting vast amount of data from a mobile device to a network at a fast data transfer rate. Wireless communication system 10 includes at least one UE 14 that may communicate wirelessly with one or more BS network system 15 serving nodes, including, but not limited to, wireless serving node 12 via one or more wireless link 20, respectively. The one or more wireless link 20, may include, but are not limited to, signaling radio bearers and/or data radio bearers. Wireless serving node 12 may be configured to transmit one or more signals 23 to UE 14 over the one or more wireless link 20, and/or UE 14 may transmit one or more signals 24 to wireless serving node 12. In an aspect, signal 23 and signal 24 may include, but are not limited to, one or more messages, such as transmitting a data packet from the UE 14 to the network via wireless serving node 12.

In an aspect, UE 14 may include a call processing component 40, which may be configured to transmit a data packet to the wireless serving node 12 over wireless link 20. Specifically, in an aspect, call processing component 40 of UE 14, may be configured to determine a size of a transmit data packet compute an early termination scheme, increase a transmission length of a CRC field, transmit the data packet with the increased transmission length of the CRC field to the network, and receive data packet with the increased transmission length of the CRC field from the network. As such, the operation of call processing component 40 of UE 14 may be capable of upgrading the quality of voice traffic and improving system performance in a wireless communication system by improving the strength of the CRC.

UE 14 may comprise a mobile apparatus and may be referred to as such throughout the present disclosure. Such a mobile apparatus or UE 14 may also be referred to by those skilled in the art as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a terminal, a user agent, a mobile client, a client, or some other suitable terminology.

Additionally, the one or more wireless nodes, including, but not limited to, wireless serving node 12 of wireless communication system 10, may include one or more of any type of network component, such as an access point, including a BS or node B, a relay, a peer-to-peer device, an authentication, authorization and accounting (AAA) server, a mobile switching center (MSC), a radio network controller (RNC), etc. In a further aspect, the one or more wireless serving nodes of wireless communication system 10 may include one or more small base stations, such as, but not limited to a femtocell, picocell, microcell, or any other small base station.

Figure 2:
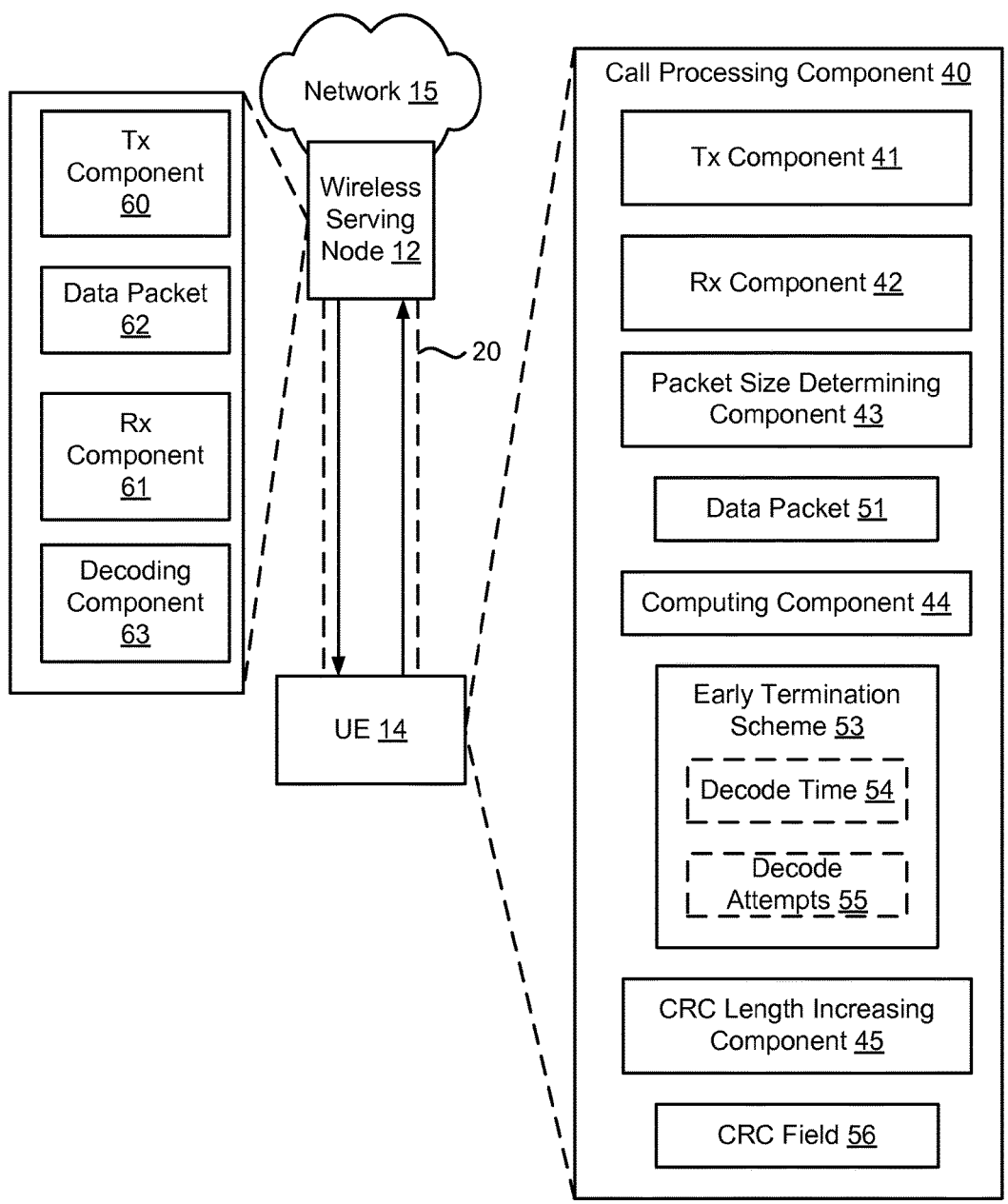
FIG. 2 is a schematic diagram illustrating exemplary aspect of call processing in a wireless communication system.

Referring to FIG. 2, in one aspect of the present apparatus and method, wireless communication system 10 is configured to include wireless communications between network 15 and UE 14. The wireless communications system may be configured to support communications between a number of users, and FIG. 2 illustrates a manner in wireless serving node 12, located in network 15, communicates with UE 14. The wireless communication system 10 can be configured for downlink message transmission or uplink message transmission over wireless link 20, as represented by the up/down arrows between network 15 and UE 14.

In an aspect, UE 14 may be configured to determine a size of transmit data packet, compute an early termination scheme, increase a transmission length of a CRC field, and transmit the data packet with the increased transmission length of the CRC field to the network, and receive a data packet with the increased transmission length of the CRC field from the network. For example, the UE 14 may be configured to transmit the data packet 51 to the network 15 via wireless serving node 12 over wireless link 20. Similarly, the UE 14 may be configured to receive data packet 62 from the network 15 via wireless serving node 12 over wireless link 20.

In an aspect, within the UE 14 resides call processing component 40. The call processing component 40 may be configured, among other things, to include a packet size determining component 43 capable of determining a size of transmit data packet 51 at a transmitting device, in this case UE 14. For example, the data packet 51 may be associated with information that is required to be sent to the network 15 via wireless serving node 12 over wireless link 20, which may include packet data transmitted as bytes, characters, or bits, as well as payload data, user data, control information, etc. In other words, packet size determining component 43 may be configured to determine the size of data packet 51 that may be transmitted from the UE 14 to the wireless serving node 12 on a channel over wireless link 20.

In another aspect, the call processing component 40 may also be configured to include a computing component 44 capable of computing an early termination scheme 53 associated with a receiving device, in this case, network 15. The actual determination of the early termination scheme 53 may be based on an estimated early decode time 54. The early decode time 54 essentially may be considered as the earliest time in which data packet 51 may be able to be decoded successfully.

In the alternative, the determination of the early termination scheme 53 may be based on a predetermined number of early decoding attempts 55. The number of early decoding attempts 55 may be considered as the lowest number of attempts in which a data packet 51 may be able to be decoded successfully.

As such, for example, the computing component 44 may be configured to compute the early termination scheme 53, which may be based on either the estimated early decode time 54 or the predetermined number of early decoding attempts 55, or a combination thereof.

In another aspect, the call processing component 40 may be configured to include a CRC length increasing component 45 capable of increasing a transmission length of CRC field 56 associated with the transmit data packet 51 before transmission of the transmit data packet 51. It should be noted that the transmitted length of the CRC field 56 may be based on either the estimated early decode time 54 and/or the predetermined number of early decoding attempts 55 of the early termination scheme 53. The transmitted length of the CRC field 56 may also be a function of the size of the transmitted data packet 51 determined by the packet size determining component 43.

Moreover, in an aspect, the increased CRC lengths are utilized specifically for transmission packets configured with early decoding enabled at the receiver, and not for other types of transmission packets. Additionally, the CRC length utilized for each transmission packet type may be transmitted to the receiving device via control channel signaling.

It is noted that the value of the new CRC length may be chosen to be large enough so that at the earliest time that the data packet can be decoded successfully, the resulting false CRC pass probability is the same as what it would be with the current CRC length when the data packet is decoded after it has been fully received. For example, the CRC length increasing component 45 increases the transmission length of a CRC field 56 of the data packet 51 such that the resulting probability of false CRC passes is the same as the probability of false CRC passes when the data packet 51 is decoded after being completely received at the network 15. This ensures that the harmful effects of false CRC passes are not made worse by the introduction of early decoding, at the relatively smaller cost of requiring a slightly higher power for the packet transmissions due to the increased total packet length after CRC attachment.

Indeed, the new CRC lengths could thus depend on the data packet size in ways that are different from those used in the current designs. For example, in the current R99 downlink, larger CRCs are used for larger data packets. However, smaller data packets such as the AMR Null packet have a higher chance of being decoded earlier, such that a receiver may attempt decoding the smaller data packets earlier than the larger data packets, resulting in higher false CRC passes. Hence, introduction of early decoding may use larger CRC lengths for smaller data packets as well, resulting in fewer false CRC passes.

As a consequence of increasing the transmission length of a CRC field 56, the strength of the CRC check may be improved, which then reduces the probability of false CRC passes. For example, the CRC length increasing component 45 increases the transmission length of a CRC field 56 based on the early termination scheme 53, computed by the computing component 44, and associated with the transmit data packet 51, determined by the packet size determining component 43, to increase the strength of the CRC check thereby reducing the probability of false CRC passes.

In another aspect, the call processing component 40 may be configured to include a transmitting (Tx) component 41 capable of transmitting the transmit data packet with the increased transmission length of the CRC field 56 to a receiving device located in wireless serving node 12. For example, the transmitting component 41 is capable of transmitting data packet 51 with an increased transmission length of CRC field 56 over wireless link 20 from the UE 14 to the network 15 via the wireless serving node 12.

In another aspect, the call processing component 40 may be configured to include a receiving (Rx) component 42 capable of receiving the transmit data packet with the increased transmission length of the CRC field from a transmit device, e.g., located in wireless serving node 12. For example, the receiving component 42 is capable of receiving data packet 62 having the increased transmission length of the CRC field over wireless link 20 at the UE 14 from the network 15 via the wireless serving node 12.

According to some aspects, false decode rate may also be reduced by receiver enhancements to the receiving component 42 that utilizes additional criteria besides the CRC check to determine whether the packet has been successfully decoded, or in other words, determine the validity of the data packet. For example, for a conventionally encoded packet, one such additional criterion is a requirement that the difference between the path-metrics of the strongest and next-strongest paths in the Viterbi decoder must exceed a threshold. The threshold controls the tradeoff between false decode and decode success rates, and could be different for different packet-sizes and decoding attempts. Indeed, the threshold is based on the received data packet size and a number of decoding attempts of the received data packet. Consequently, the cost incurred is the reduction in decode success rate owing to the fact that the additional criteria may fail even though the CRC pass was genuine.

In another aspect, the network 15 may be configured to transmit a data packet to UE 14, receive a data packet from UE 14, and decode the received data packet. For instance, the network 15 may be configured to include a transmitting (Tx) component 60 capable of transmitting a data packet 62 to the UE 14 via wireless serving node 12 over wireless link 20.

In another aspect, the network 15 may be configured to include a receiving (Rx) component 61 capable of receiving a data packet 51 with the increased transmission length of the CRC field from the UE 14 via wireless serving node 12 over wireless link 20.

Still further, the network 15 may be configured to include a decoding component 63 capable of enabling early decoding and decoding the received data packet 51 based on the increased transmission length of the CRC field sent from the UE 14 via wireless serving node 12 over wireless link 20. Note, as discussed above, the validity of the data packet is based on the CRC check of the CRC field.

It should also be noted that in addition to the transmitting (Tx) component 60, the receiving (Rx) component 61, and the decoding component 63, network 15 may be configured to include equivalents of the components residing in UE 14, described above.

Thus, aspects of this apparatus and method include improving the strength of the CRC by increasing the length of the CRC, thereby upgrading the quality of voice traffic and improving system performance in a wireless communication system. In addition, by modifying the decoder where a reliability metric (such as the difference of strongest path metrics in Viterbi Decoder) is used in discarding less reliable decoder outputs, the CRC error rate may be reduced.

The components (also referred to herein as modules and/or means) of FIG. 2 may be, for example, hardware components specifically configured to carry out the stated processes/algorithm, software components implemented by a processor configured to perform the stated processes/algorithm, and/or software components stored within a computer-readable medium for implementation by a processor, or some combination. Additional explanation of the operation of these various components will be provided below.

Figure 3:
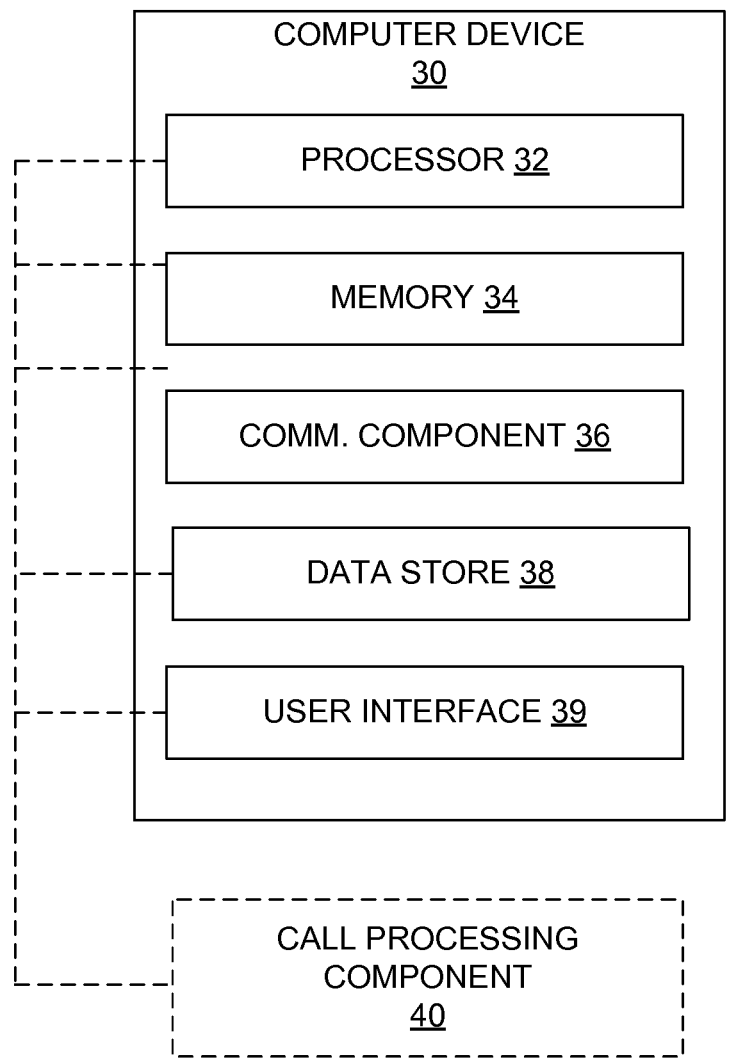
FIG. 3 is a block diagram illustrating additional example components of an aspect of a computer device having a call processing component according to the present disclosure.

Referring to FIG. 3, in one aspect, UE 14 and/or wireless serving node 12 of FIGS. 1 and/or 2 may be represented by a specially programmed or configured computer device 30, wherein the special programming or configuration includes call processing component 40, as described herein. For example, for implementation as UE 14 (FIG. 2), computer device 30 may include one or more components for computing and transmitting a data packet 51 from a wireless serving node 12 to a UE 14, such as in specially programmed computer readable instructions or code, firmware, hardware, or some combination thereof Computer device 30 includes a processor 32 for carrying out processing functions associated with one or more of components and functions described herein. Processor 32 can include a single or multiple set of processors or multi-core processors. Moreover, processor 32 can be implemented as an integrated processing system and/or a distributed processing system.

Computer device 30 further includes a memory 34, such as for storing data used herein and/or local versions of applications being executed by processor 32. Memory 34 can include any type of memory usable by a computer, such as random access memory (RAM), read only memory (ROM), tapes, magnetic discs, optical discs, volatile memory, non-volatile memory, and any combination thereof Further, computer device 30 includes a communications component 36 that provides for establishing and maintaining communications with one or more parties utilizing hardware, software, and services as described herein. Communications component 36 may carry communications between components on computer device 30, as well as between computer device 30 and external devices, such as devices located across a communications network and/or devices serially or locally connected to computer device 30. For example, communications component 36 may include one or more buses, and may further include transmit chain components and receive chain components associated with a transmitter and receiver, respectively, or a transceiver, operable for interfacing with external devices. For example, in an aspect, a receiver of communications component 36 operates to receive one or more data packet 51 from a wireless serving node 12, which may be a part of memory 34. Also, for example, in an aspect, a transmitter of communications component 36 operates to transmit data packet 51 from UE 14 to a network 15 via a wireless serving node 12 over wireless link 20

Additionally, computer device 30 may further include a data store 38, which can be any suitable combination of hardware and/or software, that provides for mass storage of information, databases, and programs employed in connection with aspects described herein. For example, data store 38 may be a data repository for applications not currently being executed by processor 32.

Computer device 30 may additionally include a user interface component 39 operable to receive inputs from a user of computer device 30, and further operable to generate outputs for presentation to the user. User interface component 39 may include one or more input devices, including but not limited to a keyboard, a number pad, a mouse, a touch-sensitive display, a navigation key, a function key, a microphone, a voice recognition component, any other mechanism capable of receiving an input from a user, or any combination thereof. Further, user interface component 39 may include one or more output devices, including but not limited to a display, a speaker, a haptic feedback mechanism, a printer, any other mechanism capable of presenting an output to a user, or any combination thereof Furthermore, computer device 30 may include, or may be in communication with, call processing component 40, which may be configured to perform the functions described herein.

Figure 4:
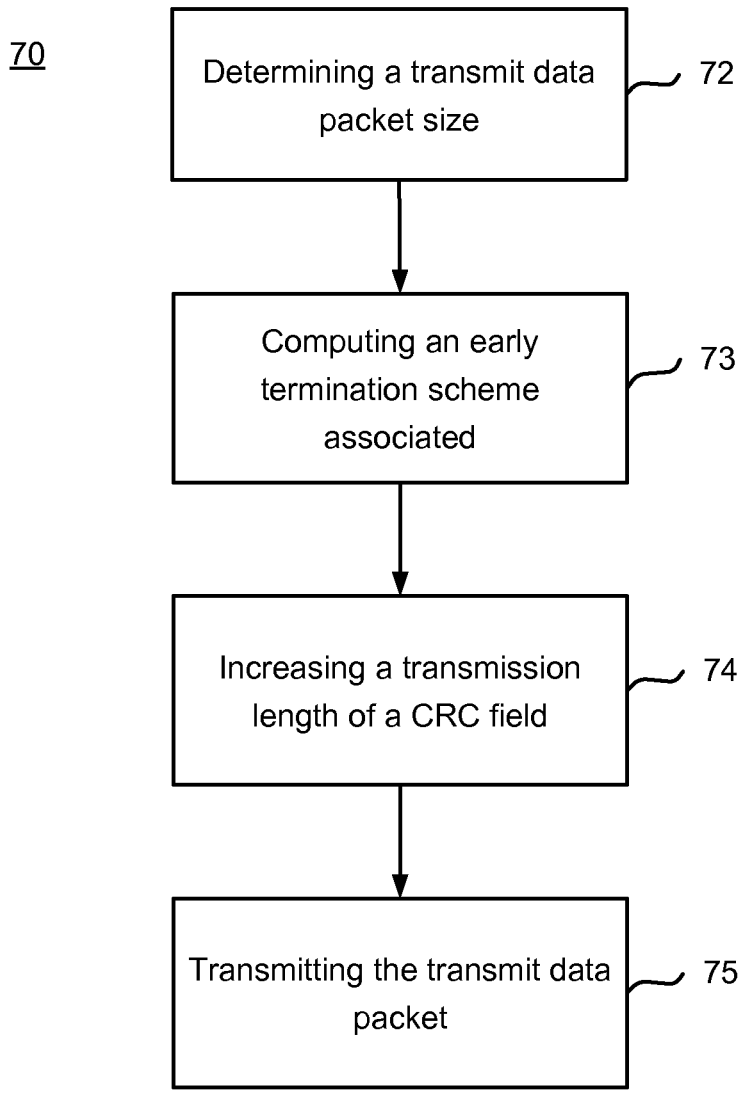
FIG. 4 is a flow diagram illustrating an exemplary method for call processing in a wireless communication system.

FIG. 4 is a flow diagram illustrating an exemplary method 70. In an aspect, method 70 may be performed by a UE (e.g., UE 14 of FIG. 2), and may be performed by a processor or other component capable of executing computer-executable instructions for performing the steps of FIG. 4. In some examples, method 70 may include a UE with a call processing component 40 that may be configured to determine a size of a transmit data packet compute an early termination scheme, increase a transmission length of a CRC field, transmit the data packet with the increased transmission length of the CRC field to the network, and receive data packet with the increased transmission length of the CRC field from the network.

At 72, the UE is configured to determine a transmit data packet size. For example, packet size determining component 43, residing in the call processing component 40 of UE 14, may be configured to execute instructions for determining the size of a data packet 51 which may be transmitted from the UE 14 to the wireless serving node 12 on a channel over wireless link 20.

At 73, the UE is configured for computing an early termination scheme associated with a receiving device. For example, the computing component 44 may be configured to execute instructions for computing the early termination scheme 53 associated with the network 15, where the early termination scheme 53 may be based on either the estimated early decode time 54 and/or the predetermined number of early decoding attempts 55.

At 74, the UE is configured for increasing a transmission length of a CRC field associated with the transmit data packet before transmission of the transmit data packet, wherein the transmitted length of the CRC field is based on the early decoding scheme. For example, the CRC length increasing component 45 may be configured to execute instructions for increasing the transmission length of a CRC field 56 associated with the transmit data packet 51 before transmission of the transmit data packet 51 to the network 15.

At 75, the UE is configured for transmitting the transmit data packet with the increased transmission length of the CRC field to the receiving device. Fox example, the transmitting component 41 may be configured for executing instructions for transmitting a data packet 51 with the increased transmission length of the CRC field 56 over wireless link 20 from the UE 14 to the network 15 via the wireless serving node 12.

In an aspect, for example, method 70 may be executed by UE 14 or network 15 (FIG. 2) executing the call processing component 40 (FIG. 2), or respective components thereof.

Figure 5:
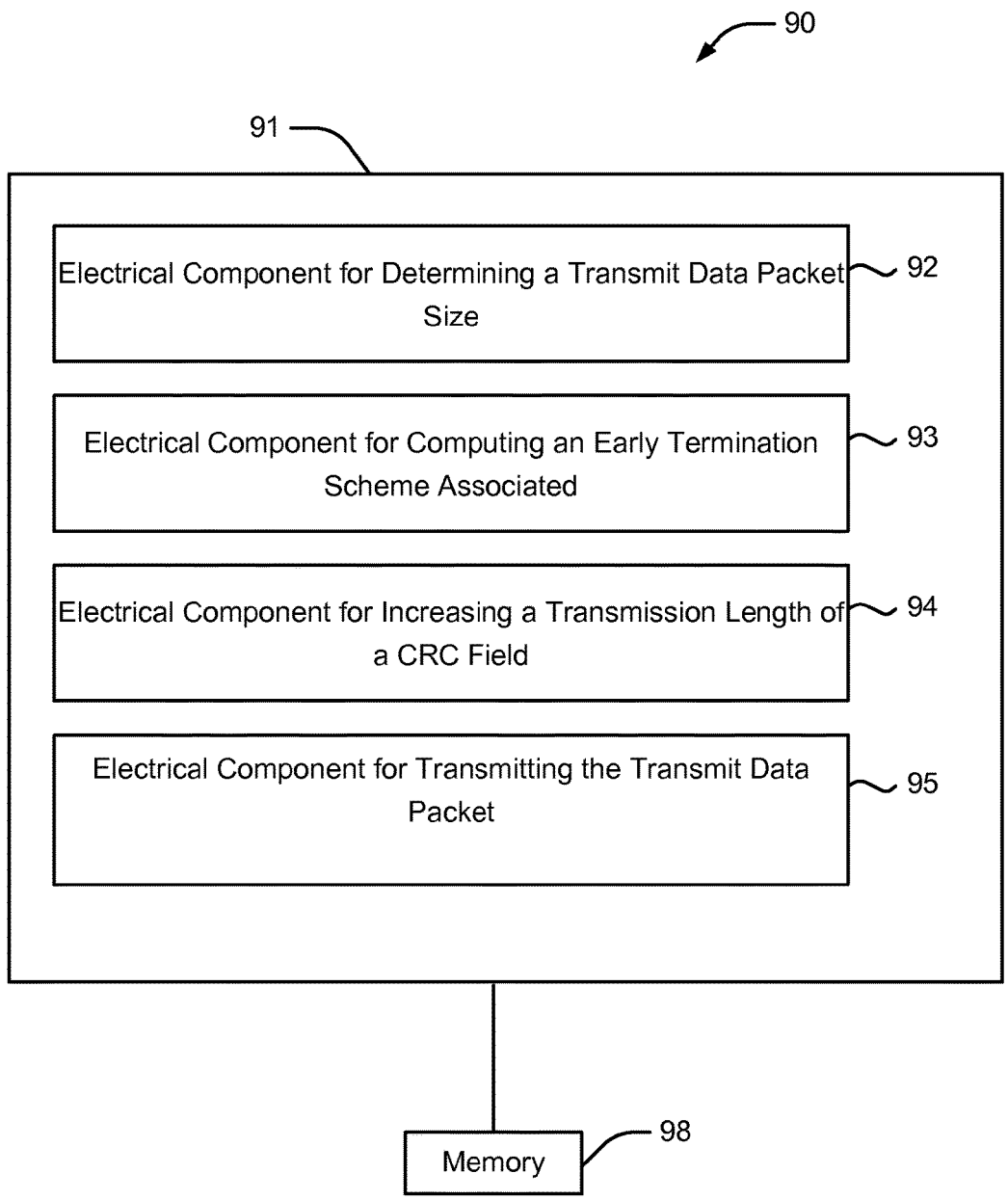
FIG. 5 is a component diagram illustrating aspects of a logical grouping of electrical components as contemplated by the present disclosure.

Referring to FIG. 5, an example system 90 is displayed for transmitting vast amount of data from a mobile device to a network. For example, system 90 can reside at least partially within UE 14 of FIGS. 1 and 2. It is to be appreciated that system 90 is represented as including functional blocks, which can be functional blocks that represent functions implemented by a processor, software, or combination thereof (e.g., firmware). For example, system 90 may be implemented via processor 32, memory 34, communications component 36, and data store 38 of FIG. 4, by for example, processor 32 executing software stored by memory 34 and/or data store 38.

Example system 90 includes a logical grouping 91 of electrical components that can act in conjunction. For instance, logical grouping 91 can include an electrical component 92 for determining a transmit data packet. In an aspect, electrical component 92 may include packet size determining component 43 (FIG. 2).

Additionally, logical grouping 91 can include an electrical component 93 for computing an early termination scheme associated. In an aspect, electrical component 93 may include computing component 44 (FIG. 2).

In an additional aspect, logical grouping 91 can include an electrical component 94 for increasing a transmission length of a CRC field. In an aspect, electrical component 94 may include CRC length increasing component 45 (FIG. 2).

Logical grouping 91 can include an electrical component 95 for Transmitting the transmit data packet from the UE 14 to the network 15. In an aspect, electrical component 94 may include transmitting component 41 (FIG. 2).

Electrical components 92-95 may correspond to one or more components in FIG. 2, and such components may be separate physical components, components implemented by processor 32 (FIG. 4), or a combination thereof.

Additionally, system 90 can include a memory 98 that retains instructions for executing functions associated with the electrical components 92-95, stores data used or obtained by the electrical components 92-95, etc. While shown as being external to memory 98, it is to be understood that one or more of the electrical components 92-95 can exist within memory 98. In one example, electrical components 92-95 can comprise at least one processor, or each electrical component 92-95 can be a corresponding module of at least one processor. Moreover, in an additional or alternative example, electrical components 92-95 can be a computer program product including a computer readable medium, where each electrical component 92-95 can be corresponding code.

Figure 6:
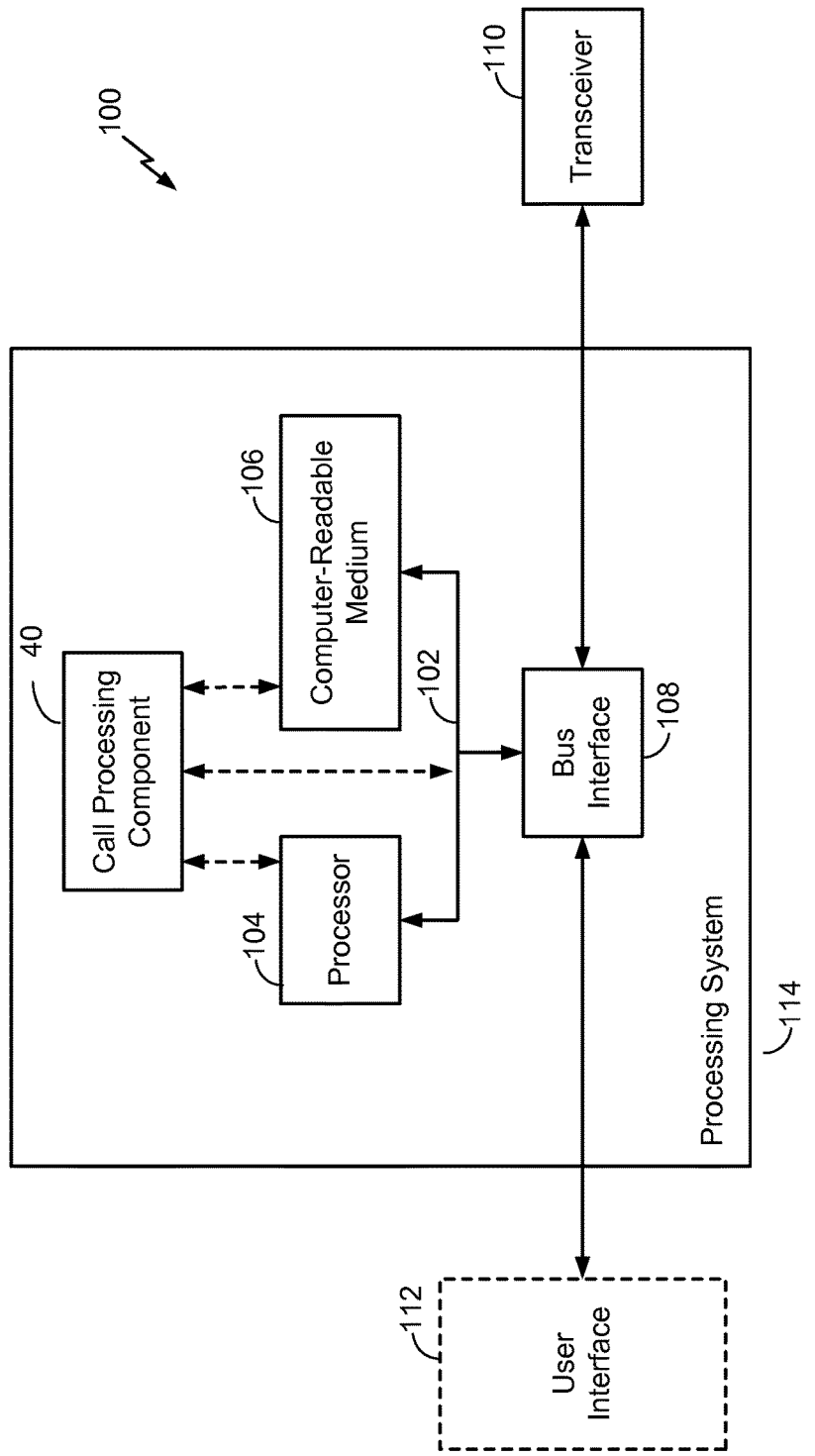
FIG. 6 is a block diagram illustrating an example of a hardware implementation for an apparatus employing a processing system to perform the functions described herein.

FIG. 6 is a block diagram illustrating an example of a hardware implementation for an apparatus 100 employing a processing system 114 for transmitting vast amount of data from a mobile device to a network. Apparatus 100 may be configured to include, for example, UE 14 (FIG. 2) and/or call processing component 40 (FIG. 2) implementing the components as described above, such as, but not limited to the transmitting component 41, receiving component 42, packet size determining component 43, computing component 44, and CRC length increasing component 45. In this example, the processing system 114 may be implemented with a bus architecture, represented generally by the bus 102. The bus 102 may include any number of interconnecting buses and bridges depending on the specific application of the processing system 114 and the overall design constraints. The bus 102 links together various circuits including one or more processors, represented generally by the processor 104, and computer-readable media, represented generally by the computer-readable medium 106. The bus 102 may also link various other circuits such as timing sources, peripherals, voltage regulators, and power management circuits, which are well known in the art, and therefore, will not be described any further. A bus interface 108 provides an interface between the bus 102 and a transceiver 110. The transceiver 110 provides a means for communicating with various other apparatus over a transmission medium. Depending upon the nature of the apparatus, a user interface 112 (e.g., keypad, display, speaker, microphone, joystick) may also be provided.

The processor 104 is responsible for managing the bus 102 and general processing, including the execution of software stored on the computer-readable medium 106. The software, when executed by the processor 104, causes the processing system 114 to perform the various functions described infra for any particular apparatus. The computer-readable medium 106 may also be used for storing data that is manipulated by the processor 104 when executing software.

In an aspect, processor 104, computer-readable medium 106, or a combination of both may be configured or otherwise specially programmed to perform the functionality of the call processing component 40, transmitting component 41, receiving component 42, packet size determining component 43, computing component 44, and CRC length increasing component 45 (FIG. 2) as described herein.

The various concepts presented throughout this disclosure may be implemented across a broad variety of telecommunication systems, network architectures, and communication standards.

Figure 7:
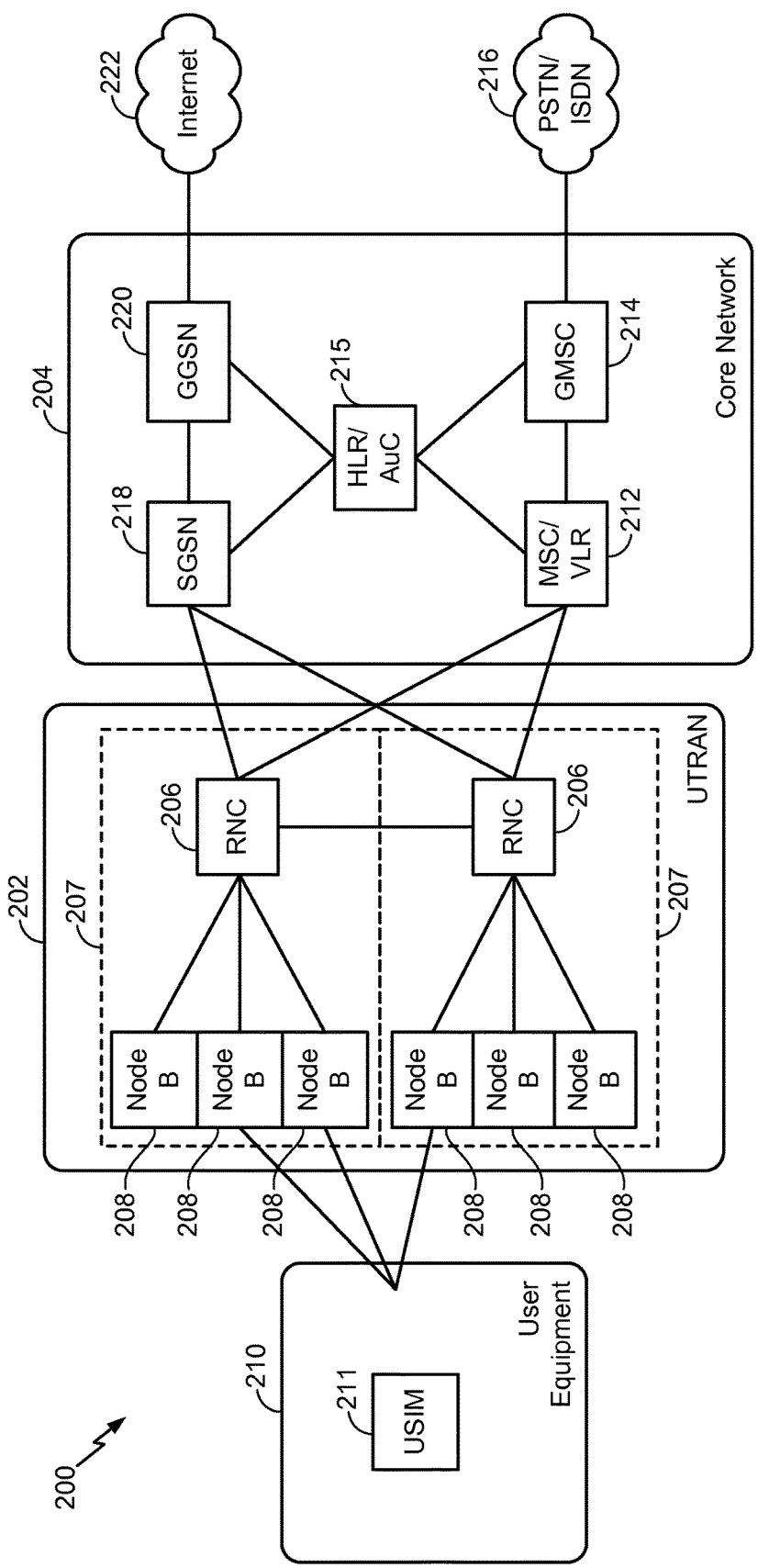
FIG. 7 is a block diagram conceptually illustrating an example of a telecommunications system including a UE configured to perform the functions described herein.

Referring to FIG. 7, by way of example and without limitation, the aspects of the present disclosure are presented with reference to a UMTS system 200 employing a W-CDMA air interface. A UMTS network includes three interacting domains: a Core Network (CN) 204, a UMTS Terrestrial Radio Access Network (UTRAN) 202, and User Equipment (UE) 210. UE 210 may be configured to include, for example, the call processing component 40, transmitting component 41, receiving component 42, packet size determining component 43, computing component 44, and CRC length increasing component 45 (FIG. 2) as described above. In this example, the UTRAN 202 provides various wireless services including telephony, video, data, messaging, broadcasts, and/or other services. The UTRAN 202 may include a plurality of Radio Network Subsystems (RNSs) such as an RNS 207, each controlled by a respective Radio Network Controller (RNC) such as an RNC 206. Here, the UTRAN 202 may include any number of RNCs 206 and RNSs 207 in addition to the RNCs 206 and RNSs 207 illustrated herein. The RNC 206 is an apparatus responsible for, among other things, assigning, reconfiguring and releasing radio resources within the RNS 207. The RNC 206 may be interconnected to other RNCs (not shown) in the UTRAN 202 through various types of interfaces such as a direct physical connection, a virtual network, or the like, using any suitable transport network.

Communication between a UE 210 and a Node B 208 may be considered as including a physical (PHY) layer and a medium access control (MAC) layer. Further, communication between a UE 210 and an RNC 206 by way of a respective Node B 208 may be considered as including a radio resource control (RRC) layer. In the instant specification, the PHY layer may be considered layer 1; the MAC layer may be considered layer 2; and the RRC layer may be considered layer 3. Information hereinbelow utilizes terminology introduced in the RRC Protocol Specification, 3GPP TS 25.331, incorporated herein by reference.

The geographic region covered by the RNS 207 may be divided into a number of cells, with a radio transceiver apparatus serving each cell. A radio transceiver apparatus is commonly referred to as a Node B in UMTS applications, but may also be referred to by those skilled in the art as a base station (BS), a base transceiver station (BTS), a radio base station, a radio transceiver, a transceiver function, a basic service set (BSS), an extended service set (ESS), an access point (AP), or some other suitable terminology. For clarity, three Node Bs 208 are shown in each RNS 207; however, the RNSs 207 may include any number of wireless Node Bs. The Node Bs 208 provide wireless access points to a CN 204 for any number of mobile apparatuses. Examples of a mobile apparatus include a cellular phone, a smart phone, a session initiation protocol (SIP) phone, a laptop, a notebook, a netbook, a smartbook, a personal digital assistant (PDA), a satellite radio, a global positioning system (GPS) device, a multimedia device, a video device, a digital audio player (e.g., MP3 player), a camera, a game console, television, computing device, entertainment device, or any other similar functioning device. The UE 210 is commonly referred to as a UE in UMTS applications, but may also be referred to by those skilled in the art as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a terminal, a user agent, a mobile client, a client, or some other suitable terminology. In a UMTS system, the UE 210 may further include a universal subscriber identity module (USIM) 211, which contains a user's subscription information to a network. For illustrative purposes, one UE 210 is shown in communication with a number of the Node Bs 208. The DL, also called the forward link, refers to the communication link from a Node B 208 to a UE 210, and the UL, also called the reverse link, refers to the communication link from a UE 210 to a Node B 208.

The CN 204 interfaces with one or more access networks, such as the UTRAN 202. As shown, the CN 204 is a GSM core network. However, as those skilled in the art will recognize, the various concepts presented throughout this disclosure may be implemented in a RAN, or other suitable access network, to provide UEs with access to types of CNs other than GSM networks.

The CN 204 includes a circuit-switched (CS) domain and a packet-switched (PS) domain. Some of the circuit-switched elements are a Mobile services Switching Centre (MSC), a Visitor location register (VLR) and a Gateway MSC. Packet-switched elements include a Serving GPRS Support Node (SGSN) and a Gateway GPRS Support Node (GGSN). Some network elements, like EIR, HLR, VLR and AuC may be shared by both of the circuit-switched and packet-switched domains. In the illustrated example, the CN 204 supports circuit-switched services with a MSC 212 and a GMSC 214. In some applications, the GMSC 214 may be referred to as a media gateway (MGW). One or more RNCs, such as the RNC 206, may be connected to the MSC 212. The MSC 212 is an apparatus that controls call setup, call routing, and UE mobility functions. The MSC 212 also includes a VLR that contains subscriber-related information for the duration that a UE is in the coverage area of the MSC 212. The GMSC 214 provides a gateway through the MSC 212 for the UE to access a circuit-switched network 216. The GMSC 214 includes a home location register (HLR) 215 containing subscriber data, such as the data reflecting the details of the services to which a particular user has subscribed. The HLR is also associated with an authentication center (AuC) that contains subscriber-specific authentication data. When a call is received for a particular UE, the GMSC 214 queries the HLR 215 to determine the UE's location and forwards the call to the particular MSC serving that location.

The CN 204 also supports packet-data services with a serving GPRS support node (SGSN) 218 and a gateway GPRS support node (GGSN) 220. GPRS, which stands for General Packet Radio Service, is designed to provide packet-data services at speeds higher than those available with standard circuit-switched data services. The GGSN 220 provides a connection for the UTRAN 202 to a packet-based network 222. The packet-based network 222 may be the Internet, a private data network, or some other suitable packet-based network. The primary function of the GGSN 220 is to provide the UEs 210 with packet-based network connectivity. Data packets may be transferred between the GGSN 220 and the UEs 210 through the SGSN 218, which performs primarily the same functions in the packet-based domain as the MSC 212 performs in the circuit-switched domain.

An air interface for UMTS may utilize a spread spectrum Direct-Sequence Code Division Multiple Access (DS-CDMA) system. The spread spectrum DS-CDMA spreads user data through multiplication by a sequence of pseudo-random bits called chips. The "wideband" W-CDMA air interface for UMTS is based on such direct sequence spread spectrum technology and additionally calls for a frequency division duplexing (FDD). FDD uses a different carrier frequency for the UL and DL between a Node B 208 and a UE 210. Another air interface for UMTS that utilizes DS-CDMA, and uses time division duplexing (TDD), is the TD-SCDMA air interface. Those skilled in the art will recognize that although various examples described herein may refer to a W-CDMA air interface, the underlying principles may be equally applicable to a TD-SCDMA air interface.

An HSPA air interface includes a series of enhancements to the 3G/W-CDMA air interface, facilitating greater throughput and reduced latency. Among other modifications over prior releases, HSPA utilizes hybrid automatic repeat request (HARQ), shared channel transmission, and adaptive modulation and coding. The standards that define HSPA include HSDPA (high speed downlink packet access) and HSUPA (high speed uplink packet access, also referred to as enhanced uplink, or EUL).

HSDPA utilizes as its transport channel the high-speed downlink shared channel (HS-DSCH). The HS-DSCH is implemented by three physical channels: the high-speed physical downlink shared channel (HS-PDSCH), the high-speed shared control channel (HS-SCCH), and the high-speed dedicated physical control channel (HS-DPCCH).

Among these physical channels, the HS-DPCCH carries the HARQ ACK/NACK signaling on the uplink to indicate whether a corresponding packet transmission was decoded successfully. That is, with respect to the downlink, the UE 210 provides feedback to the node B 208 over the HS-DPCCH to indicate whether it correctly decoded a packet on the downlink.

HS-DPCCH further includes feedback signaling from the UE 210 to assist the node B 208 in taking the right decision in terms of modulation and coding scheme and precoding weight selection, this feedback signaling including the CQI and PCI.

"HSPA Evolved" or HSPA+ is an evolution of the HSPA standard that includes MIMO and 64-QAM, enabling increased throughput and higher performance. That is, in an aspect of the disclosure, the node B 208 and/or the UE 210 may have multiple antennas supporting MIMO technology. The use of MIMO technology enables the node B 208 to exploit the spatial domain to support spatial multiplexing, beamforming, and transmit diversity.

Multiple Input Multiple Output (MIMO) is a term generally used to refer to multi-antenna technology, that is, multiple transmit antennas (multiple inputs to the channel) and multiple receive antennas (multiple outputs from the channel). MIMO systems generally enhance data transmission performance, enabling diversity gains to reduce multi-path fading and increase transmission quality, and spatial multiplexing gains to increase data throughput.

Spatial multiplexing may be used to transmit different streams of data simultaneously on the same frequency. The data steams may be transmitted to a single UE 210 to increase the data rate, or to multiple UEs 210 to increase the overall system capacity. This is achieved by spatially precoding each data stream and then transmitting each spatially precoded stream through a different transmit antenna on the downlink. The spatially precoded data streams arrive at the UE(s) 210 with different spatial signatures, which enables each of the UE(s) 210 to recover the one or more the data streams destined for that UE 210. On the uplink, each UE 210 may transmit one or more spatially precoded data streams, which enables the node B 208 to identify the source of each spatially precoded data stream.

Spatial multiplexing may be used when channel conditions are good. When channel conditions are less favorable, beamforming may be used to focus the transmission energy in one or more directions, or to improve transmission based on characteristics of the channel. This may be achieved by spatially precoding a data stream for transmission through multiple antennas. To achieve good coverage at the edges of the cell, a single stream beamforming transmission may be used in combination with transmit diversity.

Generally, for MIMO systems utilizing n transmit antennas, n transport blocks may be transmitted simultaneously over the same carrier utilizing the same channelization code. Note that the different transport blocks sent over the n transmit antennas may have the same or different modulation and coding schemes from one another.

On the other hand, Single Input Multiple Output (SIMO) generally refers to a system utilizing a single transmit antenna (a single input to the channel) and multiple receive antennas (multiple outputs from the channel). Thus, in a SIMO system, a single transport block is sent over the respective carrier.

Figure 8:
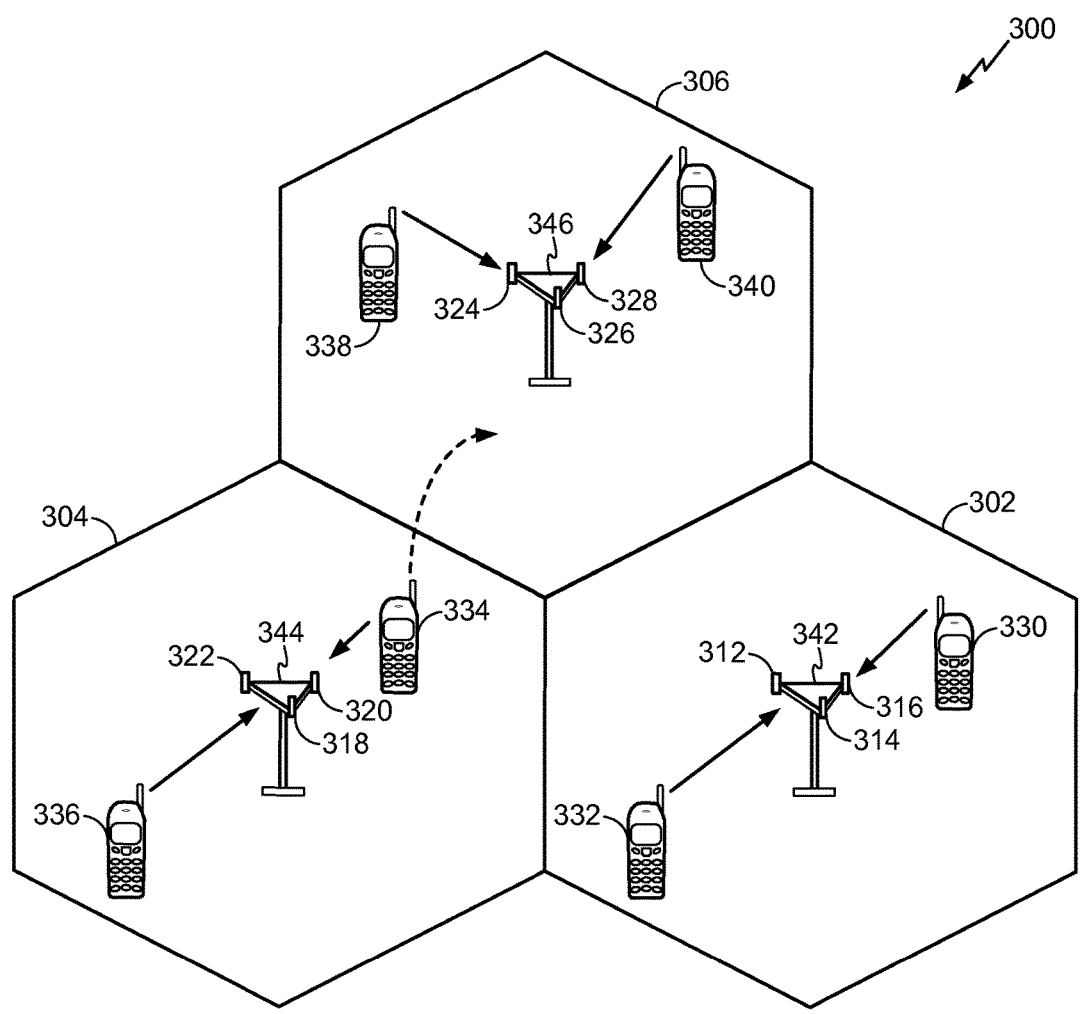
FIG. 8 is a conceptual diagram illustrating an example of an access network for use with a UE configured to perform the functions described herein.

Referring to FIG. 8, an access network 300 in a UTRAN architecture is illustrated. The multiple access wireless communication system includes multiple cellular regions (cells), including cells 302, 304, and 306, each of which may include one or more sectors. The multiple sectors can be formed by groups of antennas with each antenna responsible for communication with UEs in a portion of the cell. For example, in cell 302, antenna groups 312, 314, and 316 may each correspond to a different sector. In cell 304, antenna groups 318, 320, and 322 each correspond to a different sector. In cell 306, antenna groups 324, 326, and 328 each correspond to a different sector. The cells 302, 304 and 306 may include several wireless communication devices, e.g., User Equipment or UEs, which may be in communication with one or more of sectors of each cell 302, 304 or 306. For example, UEs 330 and 332 may be in communication with Node B 342, UEs 334 and 336 may be in communication with Node B 344, and UEs 338 and 340 can be in communication with Node B 346. Here, each Node B 342, 344, 346 is configured to provide an access point to a CN 204 (see FIG. 7) for all the UEs 330, 332, 334, 336, 338, 340 in the respective cells 302, 304, and 306. Node Bs 342, 344, 346 and UEs 330, 332, 334, 336, 338, 340 respectively may be configured to include, for example, the call processing component 40, transmitting component 41, receiving component 42, packet size determining component 43, computing component 44, and CRC length increasing component 45 (FIG. 2) as described above.

As the UE 334 moves from the illustrated location in cell 304 into cell 306, a serving cell change (SCC) or handover may occur in which communication with the UE 334 transitions from the cell 304, which may be referred to as the source cell, to cell 306, which may be referred to as the target cell. Management of the handover procedure may take place at the UE 334, at the Node Bs corresponding to the respective cells, at a radio network controller 206 (see FIG. 7), or at another suitable node in the wireless network. For example, during a call with the source cell 304, or at any other time, the UE 334 may monitor various parameters of the source cell 304 as well as various parameters of neighboring cells such as cells 306 and 302. Further, depending on the quality of these parameters, the UE 334 may maintain communication with one or more of the neighboring cells. During this time, the UE 334 may maintain an Active Set, that is, a list of cells that the UE 334 is simultaneously connected to (i.e., the UTRA cells that are currently assigning a downlink dedicated physical channel DPCH or fractional downlink dedicated physical channel F-DPCH to the UE 334 may constitute the Active Set).

The modulation and multiple access scheme employed by the access network 300 may vary depending on the particular telecommunications standard being deployed. By way of example, the standard may include Evolution-Data Optimized (EV-DO) or Ultra Mobile Broadband (UMB). EV-DO and UMB are air interface standards promulgated by the 3rd Generation Partnership Project 2 (3GPP2) as part of the CDMA2000 family of standards and employs CDMA to provide broadband Internet access to mobile stations. The standard may alternately be Universal Terrestrial Radio Access (UTRA) employing Wideband-CDMA (W-CDMA) and other variants of CDMA, such as TD-SCDMA; Global System for Mobile Communications (GSM) employing TDMA; and Evolved UTRA (E-UTRA), Ultra Mobile Broadband (UMB), IEEE 802.11 (Wi-Fi), IEEE 802.16 (WiMAX), IEEE 802.20, and Flash-OFDM employing OFDMA. UTRA, E-UTRA, UMTS, LTE, LTE Advanced, and GSM are described in documents from the 3GPP organization. CDMA2000 and UMB are described in documents from the 3GPP2 organization. The actual wireless communication standard and the multiple access technology employed will depend on the specific application and the overall design constraints imposed on the system.

The radio protocol architecture may take on various forms depending on the particular application. An example for an HSPA system will now be presented with reference to FIG. 9.

Figure 9:
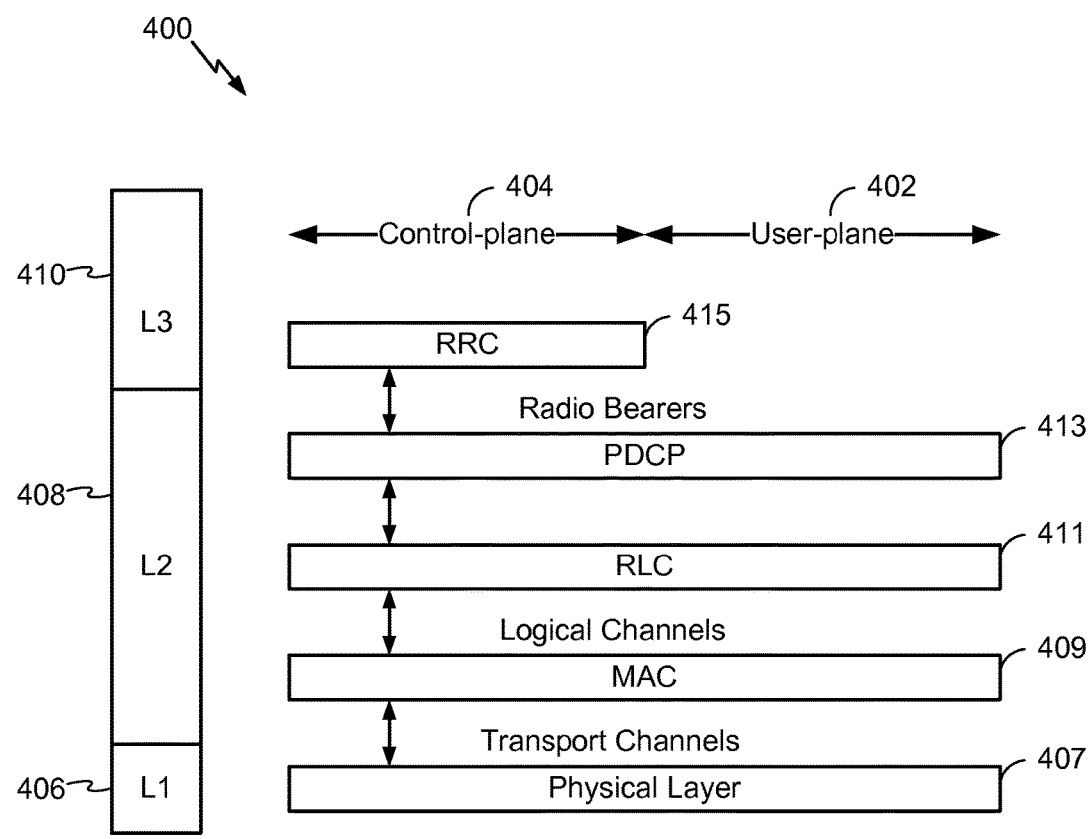
FIG. 9 is a conceptual diagram illustrating an example of a radio protocol architecture for the user and control planes for a base station and/or a UE configured to perform the functions described herein.

FIG. 9 is a conceptual diagram illustrating an example of the radio protocol architecture 400 for the user plane 402 and the control plane 404 of a user equipment (UE) or node B/base station. For example, architecture 400 may be included in a network entity and/or UE such as an entity within network 15 and/or UE14 (FIG. 2). The radio protocol architecture 400 for the UE and node B is shown with three layers: Layer 1 406, Layer 2 408, and Layer 3 410. Layer 1 406 is the lowest lower and implements various physical layer signal processing functions. As such, Layer 1 406 includes the physical layer 407. Layer 2 (L2 layer) 408 is above the physical layer 407 and is responsible for the link between the UE and node B over the physical layer 407. Layer 3 (L3 layer) 410 includes a radio resource control (RRC) sublayer 415. The RRC sublayer 415 handles the control plane signaling of Layer 3 between the UE and the UTRAN.

In the user plane, the L2 layer 408 includes a media access control (MAC) sublayer 409, a radio link control (RLC) sublayer 411, and a packet data convergence protocol (PDCP) 413 sublayer, which are terminated at the node B on the network side. Although not shown, the UE may have several upper layers above the L2 layer 408 including a network layer (e.g., IP layer) that is terminated at a PDN gateway on the network side, and an application layer that is terminated at the other end of the connection (e.g., far end UE, server, etc.).

The PDCP sublayer 413 provides multiplexing between different radio bearers and logical channels. The PDCP sublayer 413 also provides header compression for upper layer data packets to reduce radio transmission overhead, security by ciphering the data packets, and handover support for UEs between node Bs. The RLC sublayer 411 provides segmentation and reassembly of upper layer data packets, retransmission of lost data packets, and reordering of data packets to compensate for out-of-order reception due to hybrid automatic repeat request (HARQ). The MAC sublayer 409 provides multiplexing between logical and transport channels. The MAC sublayer 409 is also responsible for allocating the various radio resources (e.g., resource blocks) in one cell among the UEs. The MAC sublayer 409 is also responsible for HARQ operations.

Figure 10:
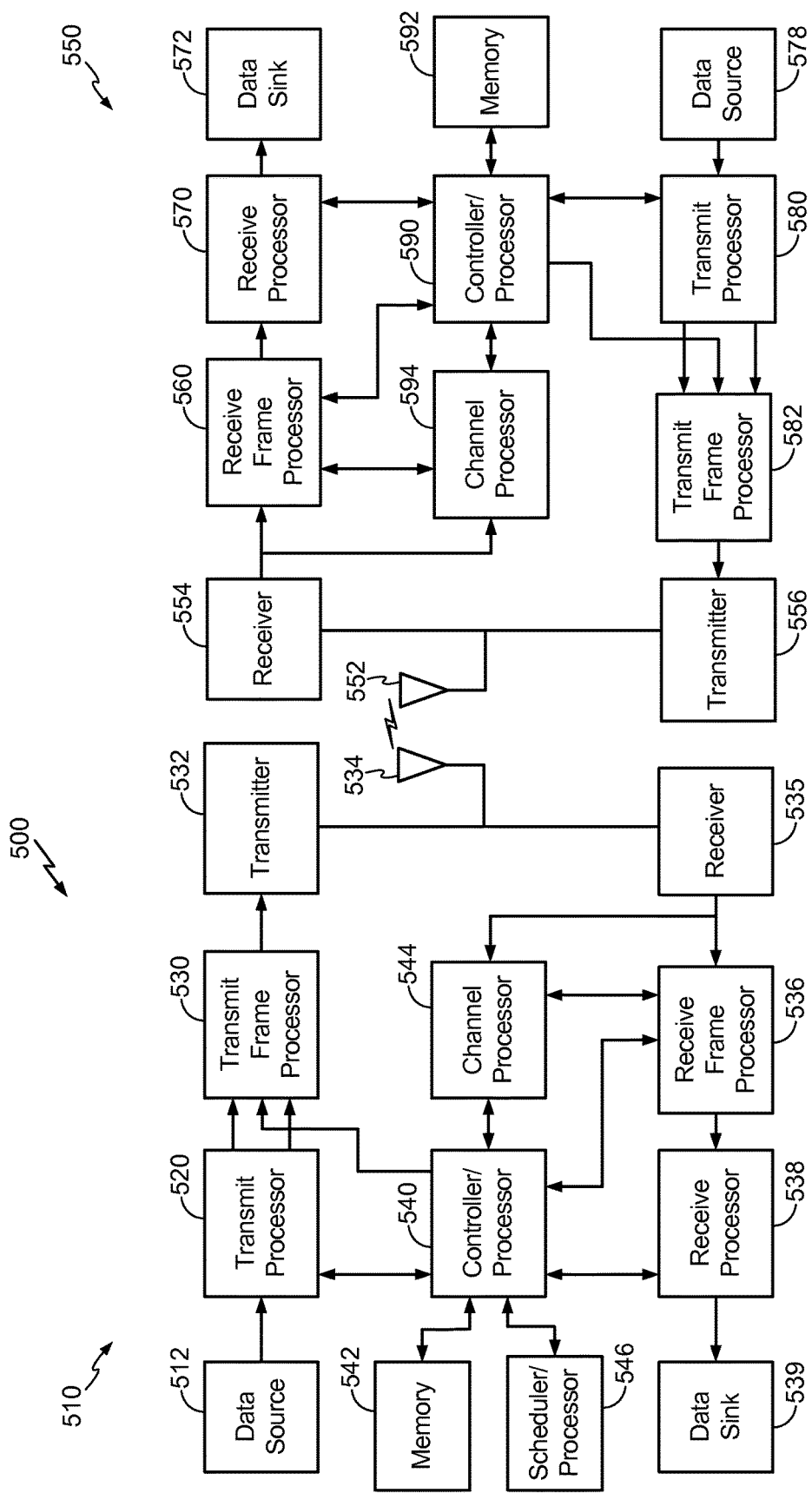
FIG. 10 is a block diagram conceptually illustrating an example of a Node B in communication with a UE in a telecommunications system configured to perform the functions described herein.

FIG. 10 is a block diagram of a communication system 500 including a Node B 510 in communication with a UE 550, where Node B 510 may be an entity within network 15 and the UE 550 may be UE 14 according to the aspect described in FIG. 2. In the downlink communication, a transmit processor 520 may receive data from a data source 512 and control signals from a controller/processor 540. The transmit processor 520 provides various signal processing functions for the data and control signals, as well as reference signals (e.g., pilot signals). For example, the transmit processor 520 may provide cyclic redundancy check (CRC) codes for error detection, coding and interleaving to facilitate forward error correction (FEC), mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM), and the like), spreading with orthogonal variable spreading factors (OVSF), and multiplying with scrambling codes to produce a series of symbols. Channel estimates from a channel processor 544 may be used by a controller/processor 540 to determine the coding, modulation, spreading, and/or scrambling schemes for the transmit processor 520. These channel estimates may be derived from a reference signal transmitted by the UE 550 or from feedback from the UE 550. The symbols generated by the transmit processor 520 are provided to a transmit frame processor 530 to create a frame structure. The transmit frame processor 530 creates this frame structure by multiplexing the symbols with information from the controller/processor 540, resulting in a series of frames. The frames are then provided to a transmitter 532, which provides various signal conditioning functions including amplifying, filtering, and modulating the frames onto a carrier for downlink transmission over the wireless medium through antenna 534. The antenna 534 may include one or more antennas, for example, including beam steering bidirectional adaptive antenna arrays or other similar beam technologies.

At the UE 550, a receiver 554 receives the downlink transmission through an antenna 552 and processes the transmission to recover the information modulated onto the carrier. The information recovered by the receiver 554 is provided to a receive frame processor 560, which parses each frame, and provides information from the frames to a channel processor 594 and the data, control, and reference signals to a receive processor 570. The receive processor 570 then performs the inverse of the processing performed by the transmit processor 520 in the Node B 510. More specifically, the receive processor 570 descrambles and despreads the symbols, and then determines the most likely signal constellation points transmitted by the Node B 510 based on the modulation scheme. These soft decisions may be based on channel estimates computed by the channel processor 594. The soft decisions are then decoded and deinterleaved to recover the data, control, and reference signals. The CRC codes are then checked to determine whether the frames were successfully decoded. The data carried by the successfully decoded frames will then be provided to a data sink 572, which represents applications running in the UE 550 and/or various user interfaces (e.g., display). Control signals carried by successfully decoded frames will be provided to a controller/processor 590. When frames are unsuccessfully decoded by the receiver processor 570, the controller/processor 590 may also use an acknowledgement (ACK) and/or negative acknowledgement (NACK) protocol to support retransmission requests for those frames.

In the uplink, data from a data source 578 and control signals from the controller/processor 590 are provided to a transmit processor 580. The data source 578 may represent applications running in the UE 550 and various user interfaces (e.g., keyboard). Similar to the functionality described in connection with the downlink transmission by the Node B 510, the transmit processor 580 provides various signal processing functions including CRC codes, coding and interleaving to facilitate FEC, mapping to signal constellations, spreading with OVSFs, and scrambling to produce a series of symbols. Channel estimates, derived by the channel processor 594 from a reference signal transmitted by the Node B 510 or from feedback contained in the midamble transmitted by the Node B 510, may be used to select the appropriate coding, modulation, spreading, and/or scrambling schemes. The symbols produced by the transmit processor 580 will be provided to a transmit frame processor 582 to create a frame structure. The transmit frame processor 582 creates this frame structure by multiplexing the symbols with information from the controller/processor 590, resulting in a series of frames. The frames are then provided to a transmitter 556, which provides various signal conditioning functions including amplification, filtering, and modulating the frames onto a carrier for uplink transmission over the wireless medium through the antenna 552.

The uplink transmission is processed at the Node B 510 in a manner similar to that described in connection with the receiver function at the UE 550. A receiver 535 receives the uplink transmission through the antenna 534 and processes the transmission to recover the information modulated onto the carrier. The information recovered by the receiver 535 is provided to a receive frame processor 536, which parses each frame, and provides information from the frames to the channel processor 544 and the data, control, and reference signals to a receive processor 538. The receive processor 538 performs the inverse of the processing performed by the transmit processor 580 in the UE 550. The data and control signals carried by the successfully decoded frames may then be provided to a data sink 539 and the controller/processor, respectively. If some of the frames were unsuccessfully decoded by the receive processor, the controller/processor 540 may also use an acknowledgement (ACK) and/or negative acknowledgement (NACK) protocol to support retransmission requests for those frames.

The controller/processors 540 and 590 may be used to direct the operation at the Node B 510 and the UE 550, respectively. For example, the controller/processors 540 and 590 may provide various functions including timing, peripheral interfaces, voltage regulation, power management, and other control functions. The computer readable media of memories 542 and 592 may store data and software for the Node B 510 and the UE 550, respectively. A scheduler/processor 546 at the Node B 510 may be used to allocate resources to the UEs and schedule downlink and/or uplink transmissions for the UEs.

Several aspects of a telecommunications system have been presented with reference to a W-CDMA system. As those skilled in the art will readily appreciate, various aspects described throughout this disclosure may be extended to other telecommunication systems, network architectures and communication standards.

By way of example, various aspects may be extended to other UMTS systems such as TD-SCDMA, High Speed Downlink Packet Access (HSDPA), High Speed Uplink Packet Access (HSUPA), High Speed Packet Access Plus (HSPA+) and TD-CDMA. Various aspects may also be extended to systems employing Long Term Evolution (LTE) (in FDD, TDD, or both modes), LTE-Advanced (LTE-A) (in FDD, TDD, or both modes), CDMA2000, Evolution-Data Optimized (EV-DO), Ultra Mobile Broadband (UMB), IEEE 802.11 (Wi-Fi), IEEE 802.16 (WiMAX), IEEE 802.20, Ultra-Wideband (UWB), Bluetooth, and/or other suitable systems. The actual telecommunication standard, network architecture, and/or communication standard employed will depend on the specific application and the overall design constraints imposed on the system.

In accordance with various aspects of the disclosure, an element, or any portion of an element, or any combination of elements may be implemented with a "processing system" or processor (FIG. 6) that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a computer-readable medium 106 (FIG. 3). The computer-readable medium 106 (FIG. 3) may be a non-transitory computer-readable medium. A non-transitory computer-readable medium includes, by way of example, a magnetic storage device (e.g., hard disk, floppy disk, magnetic strip), an optical disk (e.g., compact disk (CD), digital versatile disk (DVD)), a smart card, a flash memory device (e.g., card, stick, key drive), random access memory (RAM), read only memory (ROM), programmable ROM (PROM), erasable PROM (EPROM), electrically erasable PROM (EEPROM), a register, a removable disk, and any other suitable medium for storing software and/or instructions that may be accessed and read by a computer. The computer-readable medium may also include, by way of example, a carrier wave, a transmission line, and any other suitable medium for transmitting software and/or instructions that may be accessed and read by a computer. The computer-readable medium may be resident in the processing system, external to the processing system, or distributed across multiple entities including the processing system. The computer-readable medium may be embodied in a computer-program product. By way of example, a computer-program product may include a computer-readable medium in packaging materials. Those skilled in the art will recognize how best to implement the described functionality presented throughout this disclosure depending on the particular application and the overall design constraints imposed on the overall system.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A method of wireless communication, comprising:
   determining a transmit data packet size of a transmit data packet for transmitting from a transmitting device to a receiving device, wherein the transmit data packet is associated with a Cycle Redundancy Check (CRC) field having a current CRC transmission length;
   determining an early termination scheme associated with the receiving device decoding one or more packets before an entirety of each of the one or more packets is received;
   increasing, based on determining the early termination scheme and as a function of the transmit data packet size, the current CRC transmission length of the CRC field associated with the transmit data packet to a new CRC transmission length before transmission of the transmit data packet; and
   transmitting the transmit data packet with the CRC field according to the new CRC transmission length to the receiving device.

2. The method of claim 1, wherein determining the early termination scheme is based on at least an estimated early decode time.

3. The method of claim 1, wherein determining the early termination scheme is based on at least a predetermined number of early decoding attempts.

4. The method of claim 1, wherein the new CRC transmission length associated with the transmit data packet is utilized specifically for transmit data packets configured with early decoding.

5. The method of claim 1, further comprising:
   transmitting, to the receiving device via control channel signaling, the new CRC transmission length utilized for each of one or more transmit data packet types.

6. An apparatus for wireless communication, comprising:
   at least one processor; and
   a memory coupled to the at least one processor, wherein the at least one processor is configured to:
   determine a transmit data packet size of a transmit data packet for transmitting from a transmitting device to a receiving device, wherein the transmit data packet is associated with a Cycle Redundancy Check (CRC) field having a current CRC transmission length;
   determine an early termination scheme associated with the receiving device decoding one or more packets before an entirety of each of the one or more packets is received;
   increase, based on determining the early termination scheme and as a function of the transmit data packet size, the current CRC transmission length of the CRC field associated with the transmit data packet to a new CRC transmission length before transmission of the transmit data packet; and
   transmit the transmit data packet with the CRC field according to the new CRC transmission length to the receiving device.

7. The apparatus of claim 6, wherein the at least one processor is configured to determine the early termination scheme based on at least an estimated early decode time.

8. The apparatus of claim 6, wherein the at least one processor is configured to determine the early termination scheme based on at least a predetermined number of early decoding attempts.

9. The apparatus of claim 6, wherein the new CRC transmission length associated with the transmit data packet is utilized specifically for transmit data packets configured with early decoding.

10. The apparatus of claim 6, wherein the at least one processor is further configured to transmit, to the receiving device via control signaling, the new CRC transmission length utilized for each of one or more transmit data packet types.

11. An apparatus for wireless communication, comprising:
    means for determining a transmit data packet size of a transmit data packet for transmitting from a transmitting device to a receiving device, wherein the transmit data packet is associated with a Cycle Redundancy Check (CRC) field having a current CRC transmission length;
    means for determining an early termination scheme associated with the receiving device decoding one or more packets before an entirety of each of the one or more packets is received;
    means for increasing, based on determining the early termination scheme and as a function of the transmit data packet size, the current CRC transmission length of the CRC field associated with the transmit data packet to a new CRC transmission length before transmission of the transmit data packet; and
    means for transmitting the transmit data packet with the CRC field according to the new CRC transmission length to the receiving device.

12. A non-transitory computer readable medium comprising code executable by a computer for:
    determining a transmit data packet size of a transmit data packet for transmitting from a transmitting device to a receiving device, wherein the transmit data packet is associated with a Cycle Redundancy Check (CRC) field having a current CRC transmission length;
    determining an early termination scheme associated with the receiving device decoding one or more packets before an entirety of each of the one or more packets is received;
    increasing, based on determining the early termination scheme and as a function of the transmit data packet size, the current CRC transmission length of the CRC field associated with the transmit data packet to a new CRC transmission length before transmission of the transmit data packet; and transmitting the transmit data packet with the CRC field according to the new CRC transmission length to the receiving device.

13. A method of wireless communication, comprising:

receiving a data packet with an increased transmission length of a Cycle Redundancy Check (CRC) field from a transmitting device;

enabling early decoding of the received data packet before receipt of the entirety of the data packet based on the increased transmission length of the CRC field;

determining validity of the data packet based on a CRC check of the CRC field and based on whether path metrics of a strongest two paths in a Viterbi decoder differ by a threshold, wherein the threshold is based on a received data packet size and a number of decoding attempts of the received data packet; and decoding the received data packet.

14. An apparatus for wireless communication, comprising:

at least one processor; and a memory coupled to the at least one processor, wherein the at least one processor is configured to:

receive a data packet with an increased transmission length of a Cycle Redundancy Check (CRC) field from a transmitting device;

enable early decoding of the received data packet before receipt of the entirety of the data packet based on the increased transmission length of the CRC field;

determine validity of the data packet based on a CRC check of the CRC field and based on whether path metrics of a strongest two paths in a Viterbi decoder differ by a threshold, wherein the threshold is based on a received data packet size and a number of decoding attempts of the received data packet; and decode the received data packet.

* * * * *